United States Patent
Park et al.

(10) Patent No.: US 7,907,467 B2
(45) Date of Patent: Mar. 15, 2011

(54) RESISTANCE SEMICONDUCTOR MEMORY DEVICE HAVING THREE-DIMENSIONAL STACK AND WORD LINE DECODING METHOD THEREOF

(75) Inventors: Joon-Min Park, Seoul (KR); Sang-Beom Kang, Hwaseong-si (KR); Hyung-Rok Oh, Yongin-si (KR); Woo-Yeong Cho, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/873,836

(22) Filed: Sep. 1, 2010

(65) Prior Publication Data

US 2010/0329070 A1  Dec. 30, 2010

Related U.S. Application Data

(62) Division of application No. 12/020,237, filed on Jan. 25, 2008, now Pat. No. 7,808,811.

(30) Foreign Application Priority Data

Jan. 25, 2007 (KR) .................. 10-2007-0007697

(51) Int. Cl.
*G11C 8/00* (2006.01)
(52) U.S. Cl. .................. 365/230.03; 365/230.06
(58) Field of Classification Search ............. 365/230.03, 365/230.06
See application file for complete search history.

(56) References Cited

U.S. PATENT DOCUMENTS

| | | | | | |
|---|---|---|---|---|---|
| 4,958,326 | A | * | 9/1990 | Sakurai | 365/185.06 |
| 6,538,953 | B2 | * | 3/2003 | Hidaka | 365/230.03 |
| 6,728,149 | B2 | * | 4/2004 | Akamatsu | 365/200 |

(Continued)

FOREIGN PATENT DOCUMENTS

JP  09-180444  7/1997

(Continued)

OTHER PUBLICATIONS

English Abstract for Publication No. 09-180444, (Jul. 11, 1997).

(Continued)

*Primary Examiner* — Tuan T. Nguyen
(74) *Attorney, Agent, or Firm* — F. Chau & Associates, LLC

(57) ABSTRACT

A resistance semiconductor memory device of a three-dimensional stack structure, and a word line decoding method thereof, are provided. In the resistance semiconductor memory device of a three-dimensional stack structure, in which a plurality of word line layers and a plurality of bit line layers are disposed alternately and perpendicularly, and in which a plurality of memory cell layers are disposed between the word line layers and the bit line layers; the resistance semiconductor memory device includes a plurality of bit lines disposed on each of the bit line layers in a first direction as a length direction; a plurality of sub word lines disposed on each of the word line layers in a second direction as a length direction, intersected to the first direction; a plurality of memory cells disposed on the memory cell layers; and a plurality of main word lines individually disposed on a main word line layer specifically adapted over the bit line layers and the word line layers, in the second direction as a length direction, each one of the plurality of main word lines being shared by a predetermined number of sub word lines. An efficient word line decoding adequate to high integration can be achieved.

4 Claims, 7 Drawing Sheets

U.S. PATENT DOCUMENTS

| | | | | |
|---|---|---|---|---|
| 6,813,199 | B2* | 11/2004 | Hidaka | 365/200 |
| 6,934,214 | B2* | 8/2005 | Fujisawa et al. | 365/230.03 |
| 2003/0117872 | A1* | 6/2003 | Akamatsu | 365/201 |
| 2004/0004866 | A1* | 1/2004 | Hidaka | 365/200 |
| 2004/0047229 | A1* | 3/2004 | Fujisawa et al. | 365/232 |
| 2005/0101088 | A1 | 5/2005 | Scheuerlein et al. | |
| 2005/0226086 | A1* | 10/2005 | Sugawara | 365/230.05 |
| 2007/0279999 | A1* | 12/2007 | Watanabe et al. | 365/185.23 |

FOREIGN PATENT DOCUMENTS

| | | |
|---|---|---|
| JP | 2005-159359 | 6/2005 |
| KR | 10-2002-0072020 | 9/2002 |

OTHER PUBLICATIONS

English Abstract for Publication No. 10-2002-0072020, (Sep. 14, 2002).

English Abstract for Publication No. 2005-159359, (Jun. 16, 2005).

* cited by examiner

RESISTANCE SEMICONDUCTOR MEMORY DEVICE HAVING THREE-DIMENSIONAL STACK AND WORD LINE DECODING METHOD THEREOF

CROSS REFERENCE TO RELATED APPLICATIONS

This is a Divisional Application of U.S. patent application Ser. No. 12/020,237, filed Jan. 25, 2008 now U.S. Pat. No. 7,808,811, which claims the priority of Korean Patent Application 10-2007-0007697, filed on Jan. 25, 2007, the contents of which are hereby incorporated by reference in their entirety herein.

BACKGROUND

1. Technical Field

The present invention relates to resistance semiconductor memory devices. More particularly, the present invention relates to a resistance semiconductor memory device having a three-dimensional stack structure and a word line decoding method thereof, which is capable of obtaining an efficient word line decoding.

2. Discussion of Related Art

Nonvolatile memory device typically exhibit high capacity and low power consumption. Exemplary memory devices in this regard include, PRAM (Phase-change Random Access Memory), RRAM (Resistance random access Memory), MRAM (Magnetic Random Access Memory), FRAM (Ferro-electric Random Access Memory), etc.

MRAM uses a scheme of storing data by using a change of magnetization direction in a tunnel junction. FRAM uses a scheme of storing data by using a ferroelectric polarization characteristic. These memories typically have a high degree of integration, high speed operation, drive with low power, good retention of data, etc.

PRAM uses a scheme of storing data by using a change of resistance value based on a phase change of phase-change material. The phase change material may be chalcogenide, in which a phase is changed according to a temperature change, wherein the phase change affects a change in resistance thereof. The phase change material may be $Ge_xSb_yTe_z$ (hereinafter, referred to as 'GST') as the alloy of Ge (germanium), Sb (antimony) and Te (tellurium).

A phase of the phase change material is fast changeable between an amorphous state and a crystalline state according to temperature.

An RRAM (resistance random access memory) typically uses a characteristic such as a resistance change where a resistance value based on a voltage of complex metal oxides is changed.

A memory cell structure of a resistance semiconductor memory device using a resistance change material may be classified as one of a transistor structure and a diode structure. In the transistor structure, transistors are employed as switching devices. In the diode structure, diode is employed as switching device.

As compared with semiconductor memory devices employing the transistor structure, semiconductor memory devices employing the diode structure can allow, a write current, a greater current which increases exponentially. For this reason, it is possible to manufacture semiconductor memory devices employing the diode structure smaller than semiconductor memory devices employing the transistor structure.

FIG. 1 illustrates a memory cell structure of a resistance semiconductor memory device.

Referring to FIG. 1, a memory cell M of the resistance semiconductor memory device includes one diode D and one variable resistance device R. The variable resistance device is formed of complex metal oxides as described above.

The diode D of the memory cell M is coupled between a word line WL and the variable resistance device R. For example, a cathode terminal may be coupled to the word line WL and an anode terminal may be coupled to one end of the variable resistance device R. The variable resistance device R is coupled between the diode D and a bit line BL.

In the resistance semiconductor memory device employing a memory cell of the diode structure described above, a write operation is performed by using a reversible characteristic of the variable resistance device R based on a magnitude of current or a voltage applied to a memory cell through the bit line BL, and by using the variable resistance device R as a data storage element. In the write operation to memory cell M, when current or voltage is supplied through the bit line BL and the word line WL transitions to a low level or ground level, a forward bias is applied to the diode D, thus forming a current path in a direction of from the bit line BL to the word line WL.

A logic state of data written thereto is decided according to a level of voltage applied to the bit line BL. For example, when a write voltage of a level corresponding to data '0' is applied, the data '0' is written, and when a write voltage of a level corresponding to data '1' is applied, the data '1' is written.

In a read operation, data is decided with an amount of current flowing through memory cell according to a state of the memory cell. That is, a read voltage of a given level is applied to memory cell M, and a change in current flowing from the bit line BL to the word line WL is measured, whereby a logic state of data can be decided.

As semiconductor memory devices become increasingly high-integrated, a resistance semiconductor memory device having a memory cell of the diode structure described above will be increasing implemented. In such high integration applications, particularly in two dimensional structures, are approaching a limit. Thus, there have been endeavors to realize semiconductor memory devices having a three-dimensional structure to overcome the limit of the two dimensional structure. In realizing the semiconductor memory device of three-dimensional structure, a layout structure including word lines and an efficient method of decoding the word lines are needed.

SUMMARY

According to an embodiment of the invention, a resistance semiconductor memory device of a three-dimensional stack structure, in which a plurality of word line layers and a plurality of bit line layers are disposed alternately and perpendicularly, and in which a plurality of memory cell layers are disposed between the word line layers and the bit line layers, comprises a plurality of bit lines disposed on each of the bit line layers in a first direction, a plurality of sub word lines disposed on each of the word line layers in a second direction intersecting the first direction, a plurality of memory cells disposed on the memory cell layers, and a plurality of main word lines individually disposed on a main word line layer disposed over the bit line layers and the word line layers, in the second direction, each one of the plurality of main word lines being shared by a predetermined number of the plurality of sub word lines.

Each of the bit lines may be shared by two memory cells adjacent to upper and lower parts thereof. Each of the sub word lines may be shared by two memory cells adjacent to upper and lower parts thereof. The plurality of sub word lines in each of the word line layers may be divided to a plurality of sub word line sections and each of the plurality of main word lines may be shared by a predetermined number of sub word line sections which are disposed in the plurality of word line layers, respectively.

A plurality of sub word line sections may share one main word line, each of the plurality of sub word line sections adapted to select every word line layer. The semiconductor memory device may further comprise a vertical decoder for producing a vertical decoded signal to select a word line layer of the plurality of word line layers in response to a vertical address. The semiconductor memory device may comprise a main decoder for generating a main decoded signal to select a main word line of the plurality of main word lines in response to a main address. The semiconductor memory device may comprise a section decoder for generating a section decoded signal to select a sub word line of the second predetermined number of sub word lines within the sub word line section, in response to a section address.

The semiconductor memory device may comprise a path selection unit for performing a pass operation so that the section decoded signal is transmitted to a corresponding word line layer in response to the vertical decoded signal. The semiconductor memory device may comprise sub word line drivers individually connected to the sub word lines and operating in response to the section decoded signal. In employing a plurality of blocks, wherein a three-dimensional stack structure of the sub word lines, the bit lines and the memory cells is used as a unit of one block, the semiconductor memory device may further comprise a block decoder for selecting a block of the plurality of blocks in response to a block address.

A number of word line layers may be less than or equal to the number of sub word lines in the sub word line section.

The semiconductor memory device may comprise a main decoder for selecting a given number of main word lines from the plurality of main word lines in response to a main address, and a vertical decoder for selecting one of word line layers corresponding to the given number of main word lines in response to a vertical address. The semiconductor memory device may comprise a section decoder for generating a section decoded signal to select a sub word line of the predetermined number of sub word lines within the sub word line section, in response to a section address.

According to another embodiment of the invention, a method of decoding a signal to select a of sub word line comprises selecting a sub word line section in response to a main address and a vertical address, and selecting a sub word line in the sub word line section selected by the main address and the vertical address, in response to a section address.

The selecting of the sub word line section may comprise selecting a plurality of sub word line sections by selecting a main word line in response to the main address, and selecting the sub word line section of the plurality of sub word line sections selected by the main address in response to the vertical address. The selecting of the one sub word line section may further comprise, after a generation of the vertical address, executing a pass operation of transmitting a section decoded signal obtained by decoding the section address, to the sub word line section selected by a vertical decoded signal obtained by decoding the vertical address.

The selecting of the sub word line section may comprise selecting a plurality of sub word line sections corresponding to a number of main word lines in response to the main address, by selecting a predetermined number of main word lines, and selecting the sub word line section of the plurality of sub word line sections selected by the main address in response to the vertical address.

According to some embodiments of the invention described above, an efficient word line decoding adequate to high integration can be obtained.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF EXEMPLARY EMBODIMENTS

Embodiments of the present invention now will be described more fully hereinafter with reference to FIGS. 2 to 8, in which embodiments of the invention are shown. This invention may, however, be embodied in many different forms and should not be construed as limited to embodiments set forth herein. Rather embodiments are provided so that this disclosure will be thorough and complete, and will fully convey the scope of the invention to those skilled in the art.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein. Exemplary embodiments of the present invention are more fully described below with reference to FIGS. 2 to 8. This invention may, however, be embodied in many different forms and should not be construed as being limited to exemplary embodiments set forth herein; rather, exemplary embodiments are provided so that this disclosure is thorough and complete, and conveys the concept of the invention to those skilled in the art.

Figure 1:
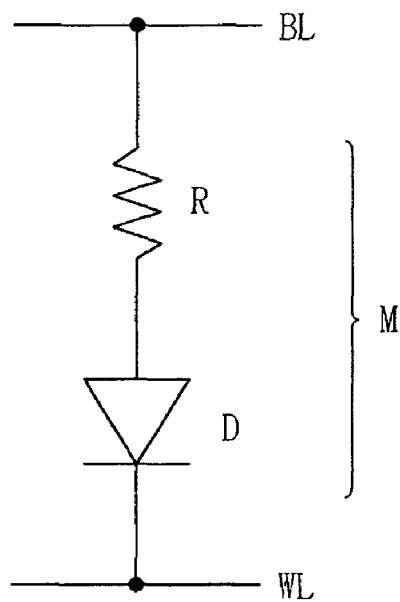
FIG. 1 is a circuit diagram of memory cell in a resistance semiconductor memory device according to the related art.
Figure 2:
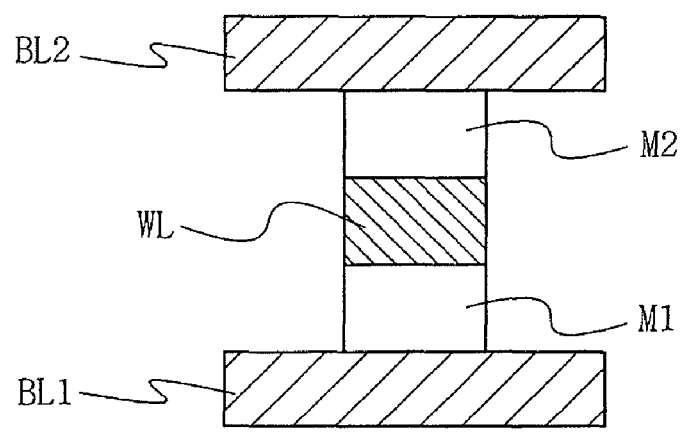
FIG. 2 illustrates a memory cell structure in a resistance semiconductor memory device according to an embodiment of the invention.

FIG. 2 depicts a memory cell structure of a resistance semiconductor memory device according to an embodiment of the invention. As shown in FIG. 2, a layout structure of a first and a second memory cell, M1 and M2, respectively, sharing a word line WL can be noted.

With reference to FIG. 2, each memory cell M1 and M2 is coupled to the word line WL and a respective bit line BL.

The first and the second memory cells M1 and M2 may be configured to share the word line WL. The first memory cell M1 is connected to a first bit line BL1 and the second memory cell M2 is connected to a second bit line BL2 provided over the first bit line BL1. The first memory cell M1 and the second memory cell M2 may be configured herein to have a perpendicular stack structure. A structure having only the first bit line BL1, the first memory cell M1 and the word line WL is the same as or similar to a plane structure of general memory cell. That is, in the memory cell structure shown in FIG. 2, memory cells M1 and M2, adjacent perpendicularly, may share a word line WL or bit line BL.

Figure 3:
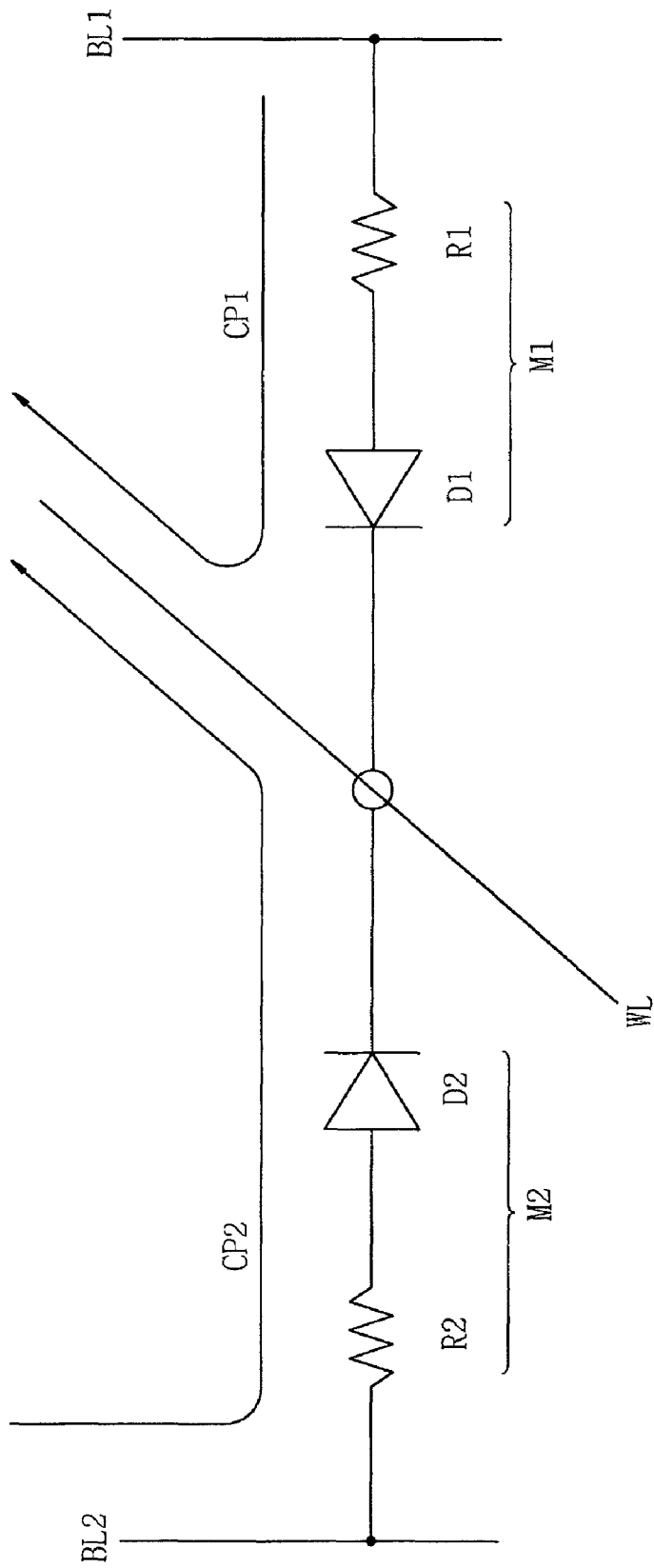
FIG. 3 is a circuit diagram of an equivalent circuit as the memory cell structure shown in FIG. 2.

FIG. 3 is a circuit diagram of an equivalent circuit as the memory cell structure shown in FIG. 2.

As shown in FIG. 3 there are the first memory cell M1 and the second memory cell M2.

One end of a variable resistance device R1 of the first memory cell M1 is coupled to the first bit line BL1, and another end is coupled to diode device D1 of the first memory cell M1. The diode device D1 of the first memory cell M1 may be configured to connect a cathode terminal to the word line WL and an anode terminal to the variable resistance device R1 of the first memory cell M1.

One end of a variable resistance device R2 of the second memory cell M2 is coupled to the second bit line BL2, and another end is coupled to a diode device D2 of the second memory cell M2. The diode device D2 of the second memory cell M2 may be configured to connect a cathode terminal to the word line WL and an anode terminal to the variable resistance device R2 of the second memory cell M2.

The first memory cell M1 and the second memory cell M2 have an upper and lower symmetrical structure from a boundary line of the word line WL, and a direction of current in the diode D is formed from the bit line BL to the word line WL.

A data storage operation is performed by storing data corresponding to a bias voltage applied to the bit lines BL1 and BL2, each connected to the first and second memory cells M1 and M2, respectively.

For example, in storing data '1' to the second memory cell M2, a bias voltage having a specific level for a write of data '1' is applied to the second bit line BL2 connected to the second memory cell M2, and the word line WL is grounded. Then a current path CP2, which continues to the word line WL through the variable resistance device R2 and the diode device D2 of the second memory cell M2, is formed. A resistance value of the variable resistance device R2 in the second memory cell M2 is changed by the current path CP2, thus storing data '1'.

In storing data '0' in the second memory cell M2, an operation opposite to the operation of storing data '1' is performed.

That is, a bias voltage having a specific level for a write of data '0' is applied to the second bit line BL2 connected to the second memory cell M2, and the word line WL is grounded. Then the current path CP2, which extends to the word line WL through the variable resistance device R2 and the diode device D2 of the second memory cell M2, is formed. A resistance value of the variable resistance device R2 in the second memory cell M2 is changed by the current path CP2, thus storing data '0'.

An operation for storing data in the first memory cell M1 is also the same as the storage of data in the second memory cell M2. That is, data '1' or '0' is stored corresponding to the resistance value of the variable resistance device R1 according to a voltage level or an amount of current flowing through a current path CP1.

A read operation for the memory cells M1 and M2 is as follows.

A bias voltage to read data is applied to the second bit line BL2 connected to the second memory cell M2, and the word line WL is grounded. The current path CP2, which continues to the word line WL, through the variable resistance device R2 and the diode device D2 of the second memory cell M2, is formed. A voltage level of the second bit line BL2 is changed according to the amount of current flowing through the current path CP2.

At this time, a level of the second bit line BL2 is compared with a reference level and data is sensed. For example, when a voltage level of the second bit line BL2 is higher than the reference level, data may be decided as '1'. When the voltage level of the second bit line BL2 is lower than the reference level, data may be decided as '0'.

Figure 4:
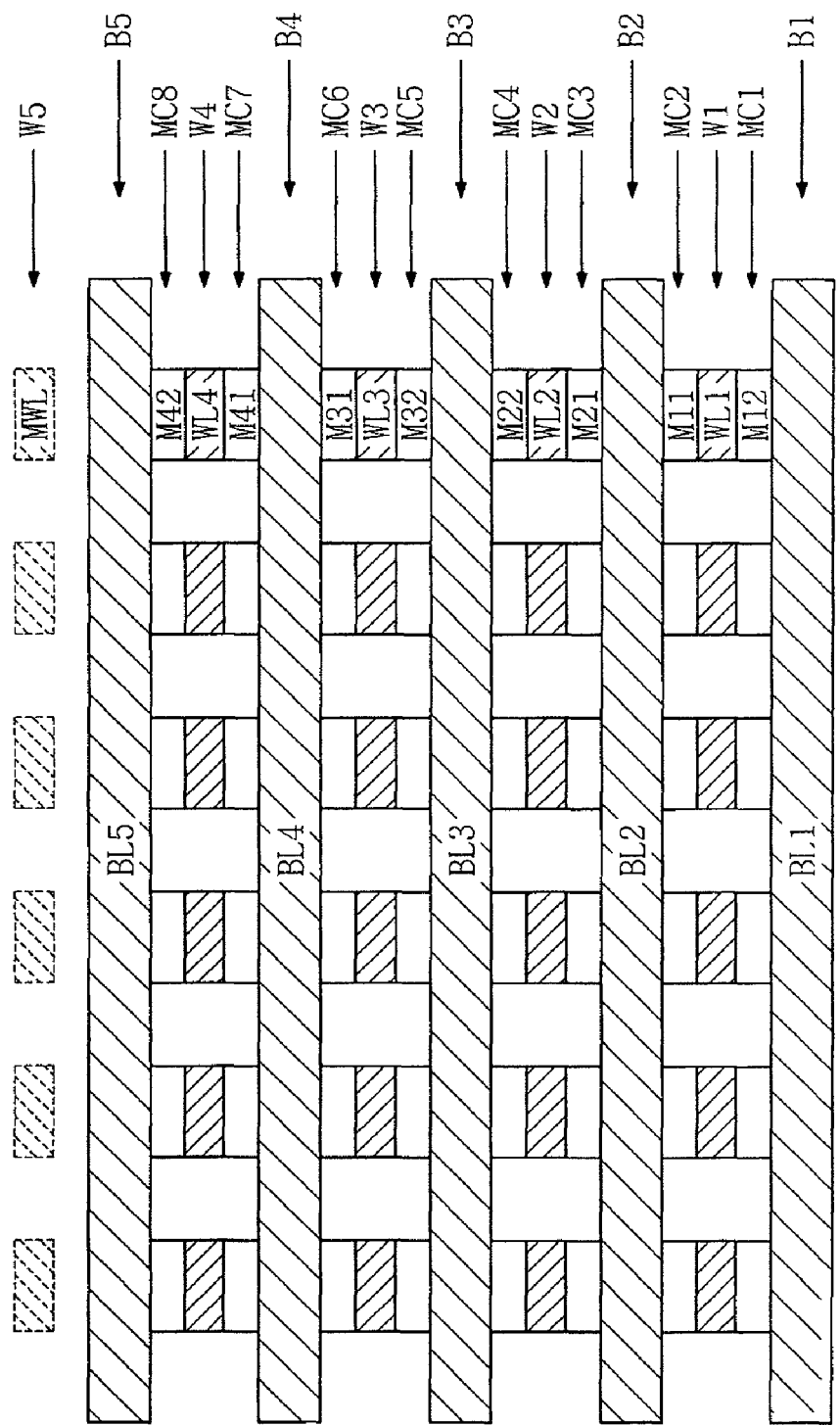
FIG. 4 schematically illustrates a structure of resistance semiconductor memory device according to an embodiment of the invention, in which memory cells based on the structure of FIGS. 2 and 3 form a three-dimensional stack structure.

FIG. 4 schematically illustrates a structure of a resistance semiconductor memory device according to an embodiment of the invention, in which memory cells M, based on the structure of FIGS. 2 and 3, form a three-dimensional stack structure.

As shown in FIG. 4, the resistance semiconductor memory device having the three-dimensional stack structure comprises a plurality of bit line layers B1, B2, B3, B4 and B5 stacked vertically, a plurality of memory cell layers MC1, MC2, MC3, MC4, MC5, MC6, MC7 and MC8, a plurality of word line layers W1, W2, W3 and W4, and a main word line layer W5.

The word line layers W1, W2, W3 and W4 and the bit line layers B1, B2, B3, B4 and B5 may be disposed alternately in a vertical direction. Respective ones of the memory cell layers MC1, MC2, MC3, MC4, MC5, MC6, MC7 and MC8 may be disposed between the word line layers W1, W2, W3, W4 and the bit line layers B1, B2, B3, B4, B5. The main word line layer W5 may be adapted over an uppermost layer (B5 in FIG. 4) among the word line layers W1, W2, W3 and W4 and the bit line layers B1, B2, B3, B4 and B5.

A plurality of bit lines BL are disposed in each of the bit line layers B1, B2, B3, B4 and B5. In a first bit line layer B1 as a lowest layer, first bit lines BL1 may be disposed lengthwise in a first direction. The first bit lines BL1 disposed in the first bit line layer B1 may be the same as the layout structure of bit lines adapted in a semiconductor memory device having a plane structure.

In the second bit line layer B2 as an upper layer of the first bit line layer B1, a plurality of second bit lines BL2 may be disposed lengthwise in the first direction. The second bit lines BL2 disposed in the second bit line layer B2 may be disposed to be superimposed, in a third direction perpendicular, over the first bit lines BL1. The third direction is substantially perpendicular to a plane of the first direction and a second direction. An X direction may correspond to the second direction, and a Y direction may correspond to the first direction, and a Z direction may correspond to the third direction.

In the third bit line layer B3 as an upper layer of the second bit line layer B2, a plurality of third bit lines BL3 may be disposed lengthwise in the first direction. The third bit lines BL3 disposed in the third bit line layer B3 may be superimposed on the first bit lines BL1 and the second bit lines BL2 in the third direction.

In the fourth bit line layer B4 as an upper layer of the third bit line layer B3, a plurality of fourth bit lines BL4 may be disposed lengthwise in the first direction. The fourth bit lines BL4 disposed in the fourth bit line layer B4 may be superimposed on the first bit lines BL1, the second bit lines BL2 and the third bit lines BL3 in the third direction.

In the fifth bit line layer B5 as an upper layer of the fourth bit line layer B4, a plurality of fifth bit lines BL5 may be disposed lengthwise in the first direction. The fifth bit lines BL5 disposed in the fifth bit line layer B5 may be superimposed on the first, second, third and fourth bit lines BL1, BL2, BL3 and BL4 in the third direction.

A first memory cell layer MC1, a first word line layer W1 and a second memory cell layer MC2 are interposed between the first bit line layer B1 and the second bit line layer B2. The first memory cell layer MC1 is disposed on the first bit line layer B1, and the first word line layer W1 is disposed on the first memory cell layer MC1. The second memory cell layer MC2 is disposed on the first word line layer W1. A plurality of first memory cells M1 are formed in the first memory cell layer MC1. A plurality of second memory cells M2 are formed in the second memory cell layer MC2.

In the first word line layer W1, first word lines WL1 are disposed lengthwise in the second direction crossed to the first direction. The first word lines WL1 may have substantially the same structure as the layout of word lines adapted in the semiconductor memory device having a plane structure.

The first bit lines BL1, the second bit lines BL2, the first word lines WL1 and the first memory cells M1 of the first memory cell layer MC1, and the second memory cells M2 of the second memory cell layer MC2 have the layout and connection structure shown in FIGS. 2 and 3.

Third memory cell layer MC3, second word line layer W2 and fourth memory cell layer MC4 are interposed between the second and third bit line layer B2 and B3. The third memory cell layer MC3 is disposed on the second bit line layer B2, and the second word line layer W2 is disposed on the third memory cell layer MC3. The fourth memory cell layer MC4 is disposed on the second word line layer W2. A plurality of third memory cells M3 are formed in the third memory cell layer MC3. A plurality of fourth memory cells M4 are disposed in the fourth memory cell layer MC4.

Second word lines WL2 are disposed lengthwise in the second direction in the second word line layer W2. The second word lines WL2 may be superimposed upon the first word lines WL1 in the third direction.

The second bit lines BL2, the third bit lines BL3, the second word lines WL2, third memory cells M3 of the third memory cell layer MC3, and fourth memory cells M4 of the fourth memory cell layer MC4 have substantially the same layout and connection structure as illustrated in FIGS. 2 and 3.

Fifth memory cell layer MC5, third word line layer W3 and sixth memory cell layer MC6 are disposed between the third bit line layer B3 and the fourth bit line layer B4. The fifth memory cell layer MC5 is disposed on the third bit line layer B3, and the third word line layer W3 is disposed on the fifth memory cell layer MC5. The sixth memory cell layer MC6 is formed on the third word line layer W3. A plurality of fifth memory cells M5 are located in the fifth memory cell layer MC5. A plurality of sixth memory cells M6 are disposed in the sixth memory cell layer MC6.

Third word lines WL3 are disposed lengthwise in the third word line layer W3 in the second direction. The third word lines WL3 are superimposed on the first word lines WL1 and the second word lines WL2 in the third direction.

The third bit lines BL3, the fourth bit lines BL4, the third word lines WL3, the fifth memory cells M5 of the fifth memory cell layer MC5, and the sixth memory cells M6 of the sixth memory cell layer MC6 have substantially the same layout and connection structure as illustrated in FIGS. 2 and 3.

Seventh memory cell layer MC7, fourth word line layer W4 and eighth memory cell layer MC8 are disposed between the fourth bit line layer B4 and the fifth bit line layer B5. The seventh memory cell layer MC7 is disposed on the fourth bit line layer B4, and the fourth word line layer W4 is disposed on the seventh memory cell layer MC7. The eighth memory cell layer MC8 is formed on the fourth word line layer W4. A plurality of seventh memory cells M7 are located in the seventh memory cell layer MC7. A plurality of eighth memory cells M8 are disposed in the eighth memory cell layer MC8.

Fourth word lines WL4 are disposed lengthwise in the fourth word line layer W4 in the second direction. The fourth word lines WL4 are superimposed on the first word lines WL1, the second word lines WL2 and third word lines WL3 in the third direction.

The fourth bit lines BL4, the fifth bit lines BL5, the fourth word lines WL4, the seventh memory cells M7 of the seventh memory cell layer MC7, and the eighth memory cells M8 of the eighth memory cell layer MC8 have substantially the same layout and connection structure as illustrated in FIGS. 2 and 3.

A semiconductor memory device having the three-dimensional stack structure described above may be further extendable in the third direction as a vertical direction, in the structure described above. For example, by adding bit line layers B, word line layers W and memory cell layers MC, a plurality of bit lines, word lines WL and memory cells M may be formed.

In the memory cells M, two memory cells, e.g., M2 and M3, adjacent in the third direction, are connected to each other, sharing one bit line BL. Further, two memory cells, e.g., M1 and M2, neighboring in the third direction, are connected to each other, sharing one word line WL.

In the main word line layer W5, a plurality of main word lines MWL are disposed in substantially the same direction as the word lines WL. The number of main word lines MWL and a connection structure between the main word lines MWL and the word lines WL are described with reference to FIGS. 5 to 8. In the following description, this word line WL is called a sub word line SWL for distinguishing from the main word line MWL. Hereinafter, a case where four word line layers are provided will be described.

Figure 5:
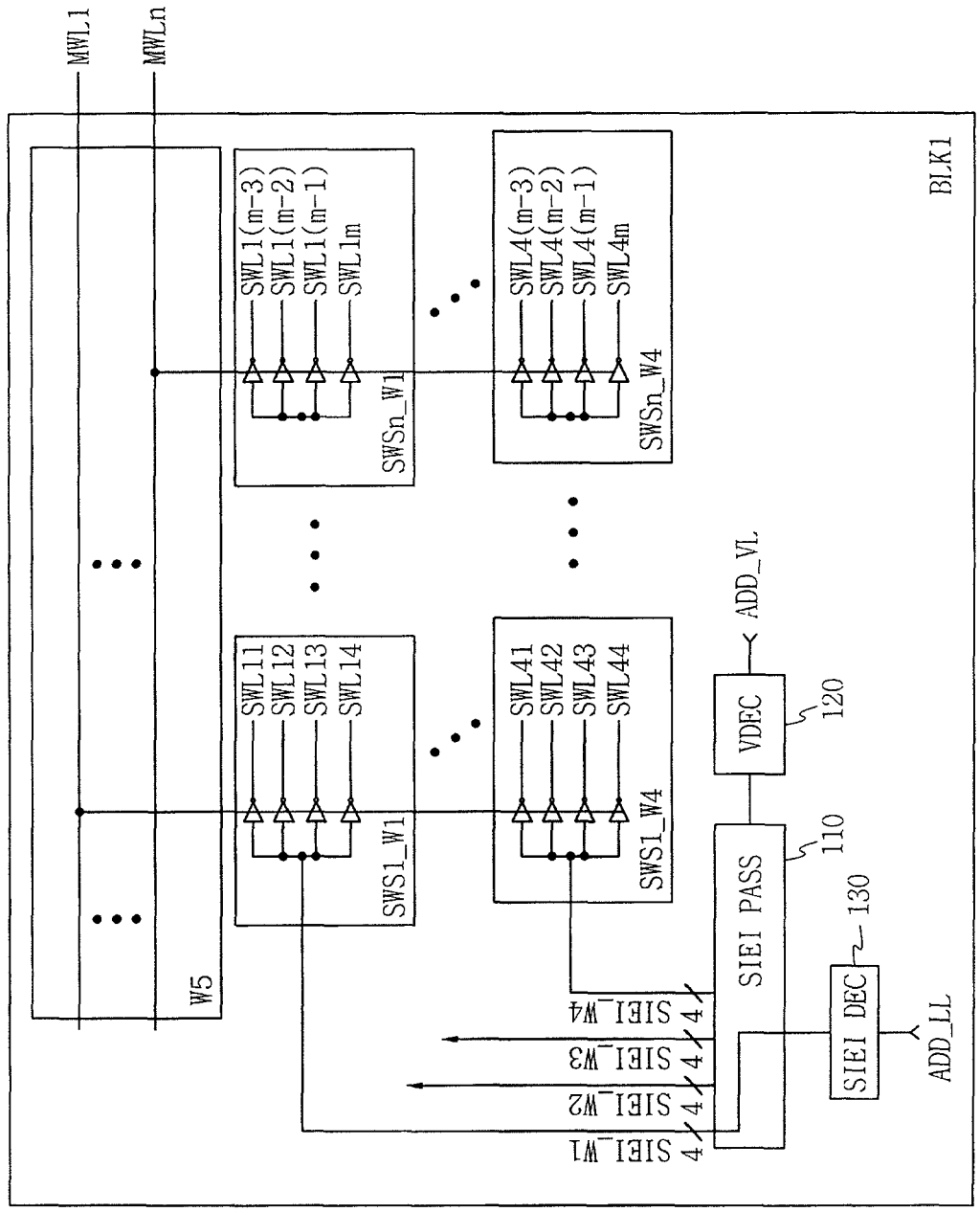
FIG. 5 illustrates an example of connection structure between word line and word line decoders of FIG. 4.

FIG. 5 illustrates an example of connection structure between word line and word line decoders of FIG. 4.

As shown in FIG. 5, in each of the word line layers W1, W2, W3 and W4, a plurality of sub word line sections SWS, in which a predetermined number of sub word lines SWL are provided as one unit, are adapted. For example, in first word line layer W1, first to nth sub word line sections SWS1_W1~SWSn_W1 may be provided, and first to nth sub word line sections SWS1_W4~SWSn_W4 may be provided in fourth word line layer W4. For example, when 1024 sub word lines SWL are used in one word line layer and four sub word lines SWL are provided as one unit, 256 sub word line sections SWS are disposed in one word line layer. In other words, in one word line layer, 256 sub word line sections SWS are formed, and 1024 sub word line sections SWS are used in all of four word line layers W1, W2, W3 and W4.

Each of the main word lines MWL disposed in the main word line layer W5 may be shared by a plurality of sub word line sections SWS, which are in the plurality of word line layers, respectively.

For example, it may be that one sub word line section SWS1_W1 of first word line layer W1, one sub word line section (not shown) of second word line layer W2, one sub word line section (not shown) of third word line layer W3, and one sub word line section SWS1_W4 of fourth word line layer W4 share one first main word line MWL1. In this structure, each of the main word lines MWL may be connected to four sub word line sections SWS disposed in different word line layer, respectively.

At this time, 256 sub word line sections SWS are disposed in one word line layer and so the number of main word lines MWL is 256. The number of main word lines MWL depends upon the number of sub word lines SWL adapted within the sub word line sections SWS, regardless of the number of word line layers. When 8 sub word lines SWL are provided within the sub word line sections SWS, the number of main world lines MWL will be 128. When the number of main word lines MWL is less than the number of sub word lines SWL adapted in the one word line layer, a thickness of the main word line MWL can be increased so as to reduce resistance and a pitch between main word lines MWL may be increased to reduce a parasitic capacitance, thereby lessening process error.

A word line decoding in the semiconductor memory device having the word line connection and layout structure described above is described as follows.

For a word line decoding, a vertical decoder (VDEC) 120, a main decoder (210 of FIG. 6) and a section decoder (SIEI DEC) 130 are implemented. A path selection unit (SIEI PASS) 110 may be added thereto.

The vertical decoder 120 produces a vertical decoded signal to select any one of the word line layers W1, W2, W3 and W4 in response to a vertical address ADD_VL.

The main decoder 210 generates a main decoded signal to select one of the main word lines MWL in response to a main address ADD_M.

The section decoder 130 generates a section decoded signal SIEI to select one of a predetermined number of sub word lines SWL within the sub word line section SWS corresponding to the selected main word line MWL and the selected word line layer, in response to a section address ADD_LL. Each of the sub word lines may be connected to one sub word line driver SWD operating in response to the section decoded signal SIEI.

The path selection unit 110 transmits the section decoded signal SIEI to a corresponding word line layer in response to the vertical decoded signal. That is, the path selection unit 110 performs a pass operation so that only sub word line section SWS of a specific word line layer receives the section decoded signal SIEI.

The main decoded signal, the vertical decoded signal and the section decoded signal may be generated by an applied address regardless of a sequence. In embodiments of the invention it may be assumed that the main decoded signal is first generated and then the vertical decoded signal and the section decoded signal are generated. Given this assumption, a decoding operation of selecting a specific sub word line will be described as follows. Here, it is assumed that a selected sub word line SWL is a second sub word line SWL12 of a first sub word line section SWS1_W1.

A first main word line MWL1, as any one of plural main word lines MWL1~MWLn, is selected by the main decoder 210. A first sub word line section SWS1_W1 of the first word line layer W1, a first sub word line section SWS1_W2 of the second word line layer W2, a first sub word line section SWS1_W3 of a third word line layer W3, and a first sub word line section SWS1_W4 of the fourth word line layer W4, which share the first main word line MWL1, are selected.

Subsequently, the first word line layer W1 is selected by a vertical decoded signal generated in response to the vertical address ADD_VL. A section decoded signal generated in response to the section address ADD_LL is transmitted to the first sub word line section SWS1_W1 of the first word line layer W1 selected by the vertical decoded signal.

Of sub word line drivers SWD connected to each of sub word lines SWL11, SWL12, SWL13 and SWL14 of the first sub word line section SWS1_W1, a sub word line driver SWD connected to a second sub word line SWL12, operates in response to the section decoded signal, thus selecting the sub word line SWL12. It should be understood that those skilled in the art, in light of the disclosure, would understand how to apply the decoding method described above to other sub word lines SWL.

Figure 6:
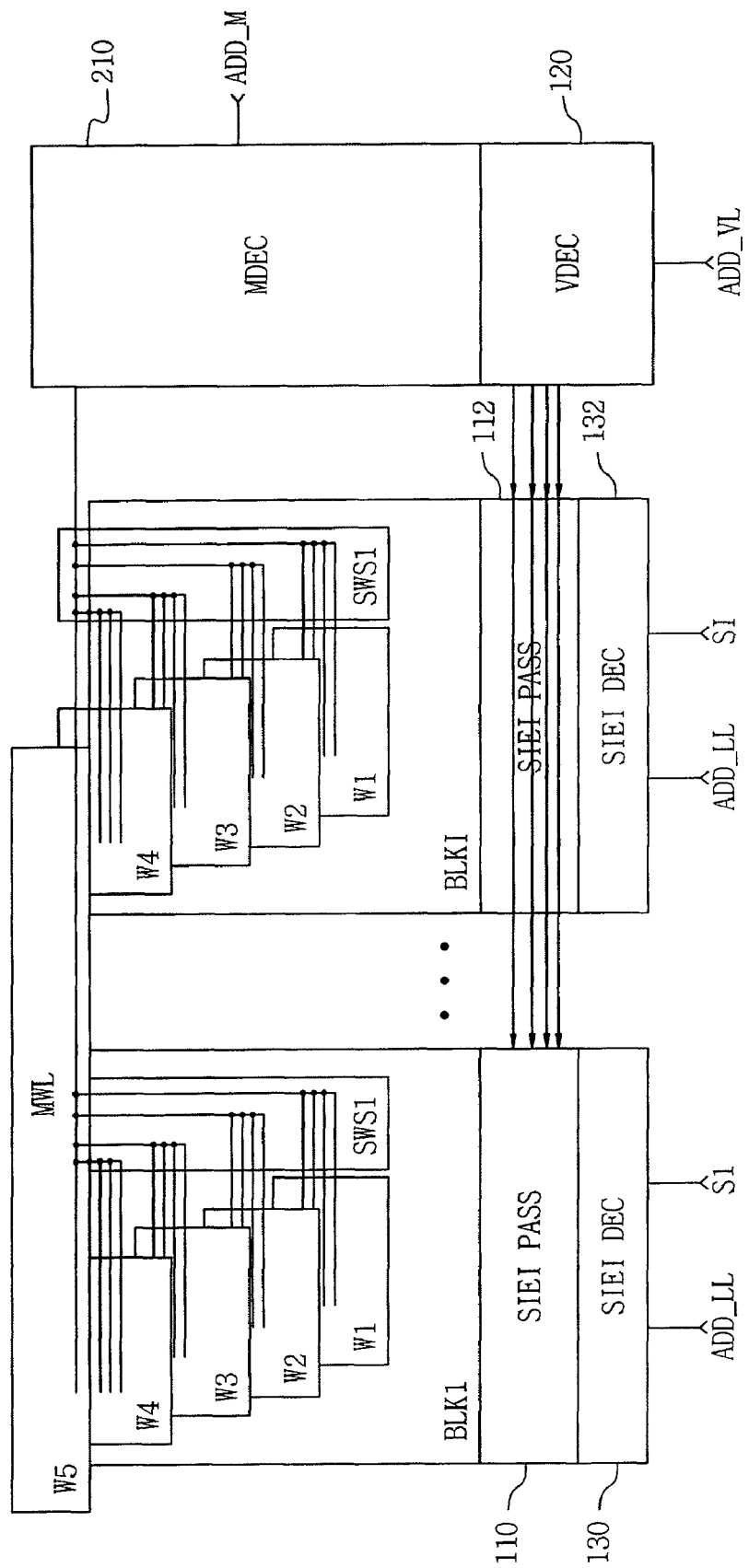
FIG. 6 is a block diagram illustrating a case when a plurality of blocks having substantially the same structure as shown in FIG. 5 are provided.

FIG. 6 is a block diagram illustrating a case where a plurality of blocks having substantially the same structure as the block BLK1 shown in FIG. 5 are provided.

As shown in FIG. 6, the vertical decoder 120 of FIG. 5 and the main decoder 210 are shared by all blocks BLK1~BLKI. The main word lines MWL may also be shared by all the blocks BLK1~BLKI as illustrated in FIG. 5. For example, the main word lines MWL may have a structure that each of the main word lines are shared by sub word line sections SWS of which each one corresponds to every word line layer W1, W2, W3, W4 provided in all blocks BLK1~BLKI.

A corresponding section decoder and path selection unit may be provided for each block BLK.

A system of FIG. 6 may further include a block decoder capable of selecting any one of the plurality of blocks BLK in response to a block address.

A word line decoding is performed in the entire structure of FIG. 6, as follows.

One of the plurality of blocks is selected in response to a block decoded signal (e.g., S1 or SI) generated in response to a block address for a selection of block. Any one MWL of a plurality of main word lines MWL1~MWLn is selected by the main decoder 210 responding to main address ADD_M. Subsequent operation is substantially the same as described in connection with FIG. 5.

Figure 7:
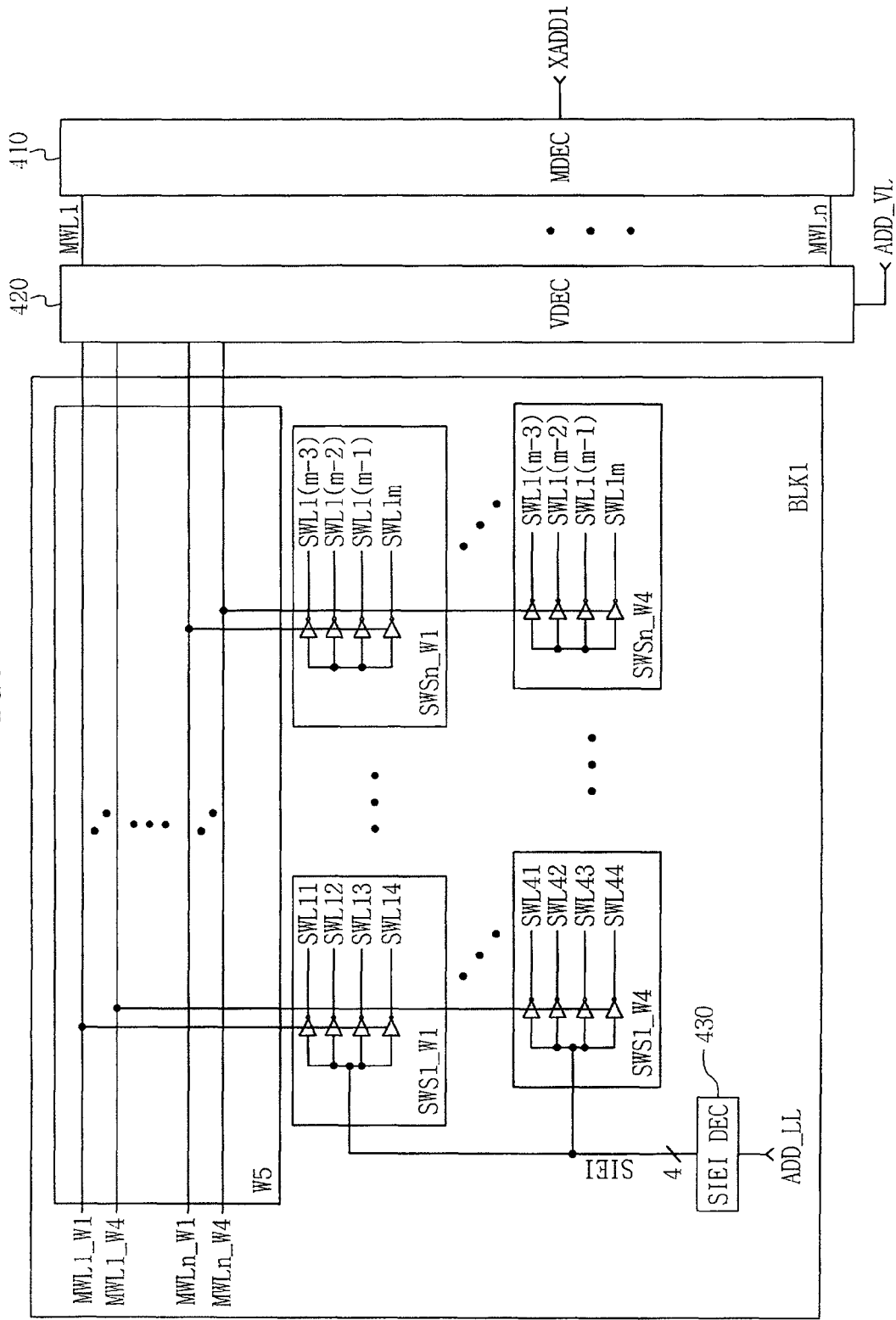
FIG. 7 illustrates another example of connection structure between word line and word line decoders of FIG. 4.

FIG. 7 illustrates another example of connection structure between word line and word line decoders of FIG. 4.

As shown in FIG. 7, a plurality of sub word line sections SWS, which have a plurality of sub word lines SWL of a predetermined number as one unit, are adapted in the respective word line layers W1, W2, W3 and W4. For example, in the first word line layer W1, first to nth sub word line sections SWS1_W1~SWSn_W1 may be provided, and first to nth sub word line sections SWS1_W4~SWSn_W4 may be provided in the fourth word line layer W4.

For example, when 1024 sub word lines SWL are used in one word line layer and four sub word lines SWL are provided as one unit, 256 sub word line sections SWS are disposed in one word line layer. In one word line layer, 256 sub word line sections SWS are disposed, and 1024 sub word line sections SWS are used in all of four word line layers W1, W2, W3 and W4.

The respective main word lines MWL of the main word line layer W5 may be disposed in a structure wherein one main word line MWL is coupled to one sub word line section SWS. Here, the main word lines MWL may be disposed corresponding to the number of sub word line sections SWS of all word line layers W1, W2, W3 and W4. Of the main word lines MWL, a predetermined number of main word lines MWL_W1~MWL_W4, each coupled to plural sub word line sections SWS_W1~SWS_W4, may be called one main word line group, each one of the plural sub word line sections capable of selecting every word line layer.

The structure described above is available when the number of word line layers W1, W2, W3 and W4 is less than or equal to the number of sub word lines SWL of the sub word line section SWS sharing the main word line MWL. When the number of main word line layers W1, W2, W3 and W4 is less than the number of sub word lines SWL of the sub word line section SWS sharing the main word line MWL, a pitch of the main word lines MWL can become large. For a case wherein the number of main word line layers W1, W2, W3 and W4 is the same as the number of sub word lines SWL of the sub word line section SWS sharing the main word line MWL, the pitch of the main word lines MWL is equal to the sub word lines SWL.

For example, in a structure having 1024 sub word lines SWL in one of four word line layers W1, W2, W3 and W4 and 256 sub word line sections SWS disposed in one word line layer; each one of the main word lines MWL is provided with each of the sub word line sections SWS of one word line layer, that is, 256 main word lines MWL are implemented. Further, for all sub word line sections SWS in four word line layers W1, W2, W3 and W4, 1024 main word lines MWL are needed.

A word line decoding in the semiconductor memory device having the word line connection and layout structure described above is described as follows.

For a word line decoding, a vertical decoder (VDEC) 420, a main decoder (MDEC) 410 and a section decoder (SIEI DEC) 430 are adapted.

The main decoder 410 generates a main decoded signal to select one of the main word line groups in response to main address ADD_M. The main decoded signal selects any one, e.g., MWL1, of main word line groups MWL1~MWLn. A predetermined number of main word lines MWL_W1~MWL_W4, each coupled to plural sub word line sections SWS_W1~SWS_W4 of which each one is selected every word line layer W, was defined above as one main word line group.

For example, when a first main word line group MWL1 is selected by the main decoded signal; a predetermined number, e.g., four, of first main word lines MWL1_W1~MWL1_W4, of which each is connected to first sub word line section SWS1_W1~SWS1_W4 in respective word line layers W1, W2, W3, W4, are selected.

The vertical decoder 420 selects any one of the word line layers W1, W2, W3 and W4 in response to vertical address ADD_VL, to select any one, e.g., MWL1_W1, of main word lines MWL1_W1~MWL1_W4 selected by the main decoder.

The section decoder 430 generates a section decoded signal SIEI to select one of a predetermined number of sub word lines SWL within the sub word line section SWS corresponding to the selected main word line group and the selected word line layer, in response to a section address ADD_LL. Each of the sub word lines SWL may be connected to one sub word line driver SWD operating in response to the section decoded signal.

The main decoded signal, the vertical decoded signal and the section decoded signal may be generated by an applied address regardless of a sequence. For example, any one word line layer may be selected through the vertical decoder 420 and one of plural main word lines MWL connected to each of sub word line sections SWS of a corresponding word line layer may be selected through the main decoder 410.

It may be assumed herein that the main decoded signal is first generated and then only the vertical decoded signal and the section decoded signal are generated. In this assumption, a decoding operation to select a specific sub word line will be described as follows. It may be assumed that the selected sub word line SWL is a second sub word line SWL12 in first sub word line section SWS1_W1 of first word line layer W1.

A first main word line group MWL1, as any one of a plurality of first to nth main word line groups MWL1~MWLn, is selected by the main decoder 210. A first sub word line section SWS1_W1 of the first word line layer W1, a first sub word line section SWS1_W2 of the second word line layer W2, a first sub word line section SWS1_W3 of a third word line layer W3, and a first sub word line section SWS1_W4 of the fourth word line layer W4, which are individually connected to main word lines MWL1_W1~MWL1_W4 of the first main word line group MWL1, are selected.

The first word line layer W1 is selected by a vertical decoded signal generated in response to the vertical address ADD_VL. Thus, the first sub word line section SWS1_W1 is selected. Section decoded signal SIEI generated in response to section address ADD_LL is transmitted to the first sub word line section SWS1_W1 of the first word line layer W1 selected by the vertical decoded signal.

A sub word line driver SWD connected to a second sub word line SWL12 among sub word line drivers SWD connected to each of sub word lines SWL11, SWL12, SWL13 and SWL14 of the first sub word line section SWS1_W1, operates in response to the section decoded signal SIEI, thus selecting the sub word line SWL12.

One of ordinary skill in the art would understand that a decoding method as described above may be applied to other sub word lines SWL.

Figure 8:
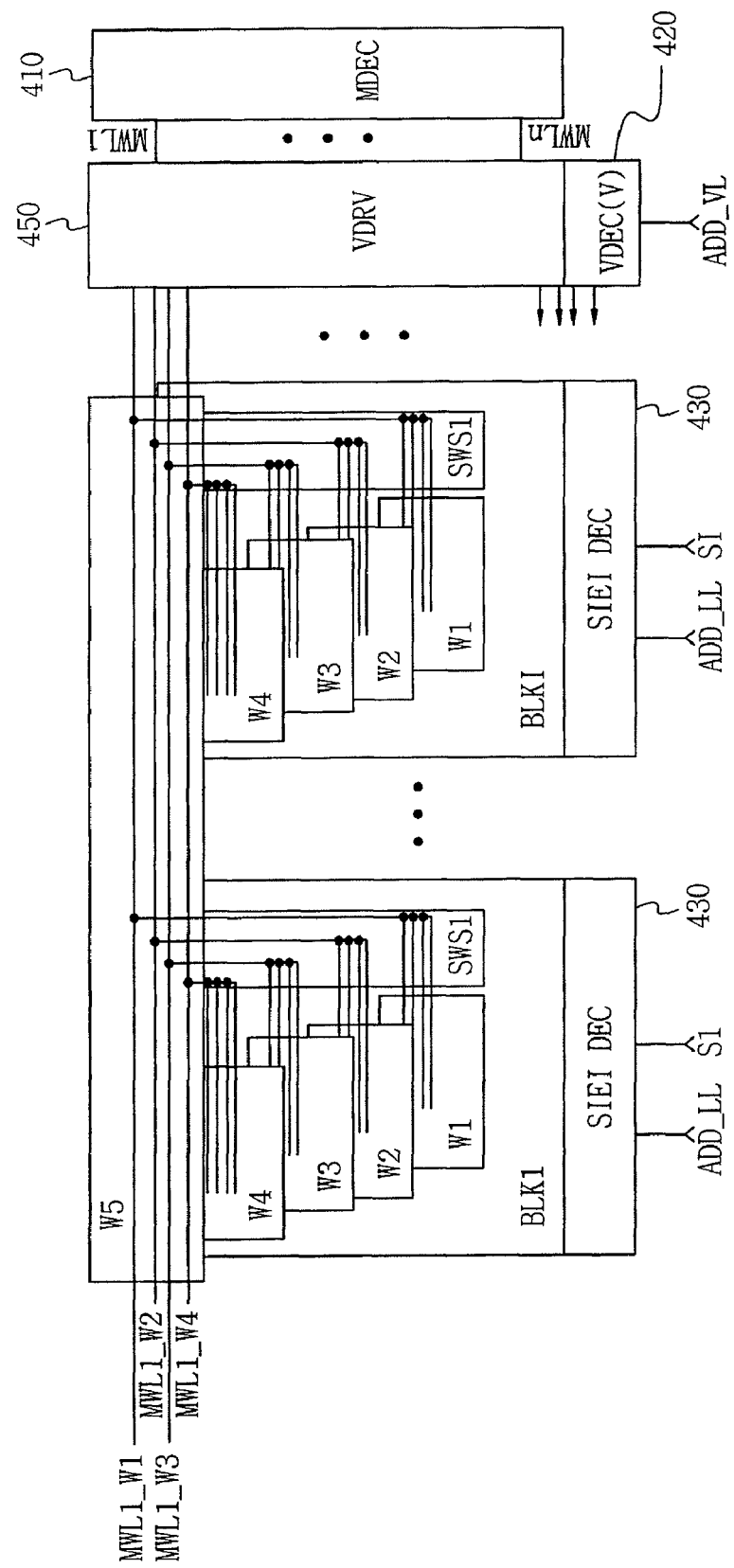
FIG. 8 is a block diagram illustrating a case when a plurality of blocks having substantially the same structure as shown in FIG. 7.

FIG. 8 is a block diagram illustrating a case when a plurality of blocks having substantially the same structure as shown in FIG. 7 are provided.

Referring to FIG. 8, the vertical decoder 420 and main decoder 410 of FIG. 7 are shared by all blocks BLK1~BLKI. The main word lines MWL are also shared by all the blocks BLK. A driver (VDRV) 450 may be implemented to drive an output of the main decoder 410 or the vertical decoder (VDEC(V)) 420.

Respective ones of the section decoders 430 may be configured to be in communication with each block BLK.

A block decoder (not shown) may be disposed for selecting any one of the plurality of blocks BLK in response to block address.

A word line decoding in the overall structure of FIG. 8 is performed as follows. One of a plurality of blocks, e.g., BLK1, is selected by block decoded signal (e.g., S1-SI) generated in response to a block address for a selection of block. Any one MWL1 of plurality of main word line groups MWL1~MWLn is selected by the main decoder 410 responding to main address ADD_M. Operation thereafter is substantially the same as that described referring to FIG. 7.

As described above, according to some embodiments of the invention, word lines are disposed in a three-dimensional structure and a word line decoding is performed, thereby obtaining an word line decoding in high integration applications.

The resistance semiconductor memory device may be applied to RRAM, MRAM, PRAM, or the like, and is also applicable to all semiconductor memory devices having other resistance devices and diode structure.

It will be apparent to those skilled in the art that modifications and variations can be made in the present invention without deviating from the spirit or scope of the invention. Thus, it is intended that the present invention cover any such modifications and variations of this invention. Accordingly, these and other changes and modifications are seen to be within the true spirit and scope of the invention.

In the drawings and specification, there have been disclosed exemplary embodiments of the invention and, although specific terms are employed, they are used in a generic and descriptive sense only and not for purposes of limitation, the scope of the invention.

What is claimed is:

1. A method of decoding a signal to select a sub word line comprising:
    selecting a sub word line section in response to a main address and a vertical address; and
    selecting a sub word line in the sub word line section selected by the main address and the vertical address, in response to a section address.

2. The method of claim 1, wherein the selecting of the sub word line section comprises:
    selecting a plurality of sub word line sections by selecting a main word line in response to the main address; and
    selecting the sub word line section of the plurality of sub word line sections selected by the main address in response to the vertical address.

3. The method of claim 2, wherein the selecting of the sub word line section further comprises, after a generation of the vertical address, executing a pass operation of transmitting a section decoded signal obtained by decoding the section address, to the sub word line section selected by a vertical decoded signal obtained by decoding the vertical address.

4. The method of claim 1, wherein the selecting of the sub word line section comprises:
    selecting a plurality of sub word line sections corresponding to a number of main word lines in response to the main address, by selecting a predetermined number of main word lines; and
    selecting the sub word line section of the plurality of sub word line sections selected by the main address in response to the vertical address.

* * * * *